US008723069B2

(12) United States Patent
Jecke et al.

(10) Patent No.: US 8,723,069 B2
(45) Date of Patent: May 13, 2014

(54) VIEWING WINDOW AND GROUND CONTACT CONNECTION FOR A HIGH-VOLTAGE ARRANGEMENT

(75) Inventors: Mario Jecke, Dresden (DE); Andreas Kleinschmidt, Oranienburg (DE)

(73) Assignee: Siemens Aktiengesellschaft, Munich (DE)

( * ) Notice: Subject to any disclaimer, the term of this patent is extended or adjusted under 35 U.S.C. 154(b) by 132 days.

(21) Appl. No.: 13/380,585

(22) PCT Filed: Jun. 8, 2010

(86) PCT No.: PCT/EP2010/057952
§ 371 (c)(1), (2), (4) Date: Jan. 3, 2012

(87) PCT Pub. No.: WO2010/149483
PCT Pub. Date: Dec. 29, 2010

(65) Prior Publication Data

US 2012/0092847 A1 Apr. 19, 2012

(30) Foreign Application Priority Data

Jun. 23, 2009 (DE) ........................ 10 2009 030 610

(51) Int. Cl.
*H01H 33/00* (2006.01)
*H05K 7/00* (2006.01)

(52) U.S. Cl.
USPC ............................................ 218/43; 361/837

(58) Field of Classification Search
USPC ......... 361/837, 600, 628, 630, 632, 646, 828, 361/832, 833, 835; 218/43–88, 154, 155
See application file for complete search history.

(56) References Cited

U.S. PATENT DOCUMENTS

| | | | | |
|---|---|---|---|---|
| 3,569,641 | A | | 3/1971 | Rintje et al. |
| 5,578,804 | A | | 11/1996 | Berger et al. |
| 5,578,805 | A | | 11/1996 | Berger et al. |
| 5,721,412 | A | | 2/1998 | Schifko et al. |
| 5,814,782 | A | * | 9/1998 | Muller et al. ................. 218/143 |
| 5,828,025 | A | * | 10/1998 | Neumaier et al. .............. 218/79 |
| 2009/0015991 | A1 | | 1/2009 | Hyrenbach et al. |

FOREIGN PATENT DOCUMENTS

| | | | |
|---|---|---|---|
| CN | 1142118 | A | 2/1997 |
| CN | 1165385 | A | 11/1997 |
| CN | 1173727 | A | 2/1998 |
| DE | 1913981 | A1 | 11/1970 |
| DE | 4420524 | A1 | 12/1995 |
| DE | 19825386 | A1 | 12/1999 |
| DE | 10205334 | C1 | 11/2003 |
| DE | 10219055 | B4 | 4/2004 |
| EP | 0678955 | A1 | 10/1995 |
| EP | 0744803 | A2 | 11/1996 |
| RU | 11407 | U1 | 9/1999 |
| WO | 2005122352 | A1 | 12/2005 |

* cited by examiner

*Primary Examiner* — Jenny L Wagner
*Assistant Examiner* — Ahmad D Barnes
(74) *Attorney, Agent, or Firm* — Laurence A. Greenberg; Werner H. Stemer; Ralph E. Locher

(57) ABSTRACT

A high-voltage arrangement has at least one switching device, a housing and a drive for the switching device. The housing is formed with a first housing opening and a second housing opening. Both the first and second housing openings are suitable for the selective fitting of a viewing window or a ground contact connection.

4 Claims, 8 Drawing Sheets

VIEWING WINDOW AND GROUND CONTACT CONNECTION FOR A HIGH-VOLTAGE ARRANGEMENT

BACKGROUND OF THE INVENTION

Field of the Invention

The invention relates to a high-voltage arrangement having a switching device. A high-voltage arrangement such as this is known, for example, from German laid-open specification DE 102 19 055.

BRIEF SUMMARY OF THE INVENTION

The invention is based on the object of specifying a high-voltage arrangement which offers a high level of flexibility for assembly of the high-voltage arrangement.

According to the invention, this object is achieved by a high-voltage arrangement having the features as claimed. Advantageous refinements of the high-voltage arrangement according to the invention are specified in dependent claims.

The invention accordingly provides that the high-voltage arrangement has a housing with a first housing opening and a second housing opening, with both the first and the second housing openings being suitable for selectively fitting a viewing window or a ground contact connection to them.

One major advantage of the invention is that the viewing window and the ground contact connection can be interchanged, thus allowing the high-voltage arrangement to be reconfigured easily.

In the case of an axially symmetrical housing, the first housing opening and the second housing opening are preferably opposite one another with respect to the axis of symmetry. The first housing opening and the second housing opening are preferably identical, in order to allow simple replacement of the viewing window and ground contact connection, if the transmission is intended to be fitted rotated through 180° within the housing.

By way of example, the ground contact connection forms the third connection of the high-voltage arrangement, and can be connected through the switching device to the first contact.

In addition, it is considered to be preferable if the two housing openings and a viewing window which is inserted into one of the two housing openings are of such a size and are aligned such that both the position of a first electrical contact element, which can connect the first connection and the second connection to one another, and the position of a second electrical contact element, which can connect the first connection and the third connection to one another, can be seen from the outside through the viewing window.

In addition, it is considered to be advantageous if the drive is arranged in the housing on a center axis which runs through the housing center of the housing, if the drive axis is at right angles to the center axis, and if the movement path of one of the electrical contact elements lies on the center axis and parallel to it. One advantage of this variant is that the transmission and the switching device can be fitted differently within the housing, for example rotated through 180°, without having to make any physical changes to the transmission or to the switching device.

The housing is preferably axially symmetrical, and the center axis preferably forms an axis of symmetry of the housing. The movement axis or the movement path of the two electrical contact elements is preferably at right angles to the drive axis of the drive.

One of the two contact elements forms, for example, a ground contact element, and the other of the two contact elements forms, for example, a disconnecting contact element of the switching device.

It is also considered to be advantageous if the switching device has a transmission with two coupling rods, which can be pivoted on a predetermined pivoting plane and each move an associated electrical contact element during pivoting, thus making it possible to change the switch position of the switching device, with the switching device connecting a first connection to a second connection in a first switch position, and connecting the first connection to a third connection in a second switch position, and with the three connections being left unconnected in a third switch position, in that a drive axis of a drive of the high-voltage arrangement is arranged at right angles to the pivoting plane of the coupling rods, and in that the two coupling rods are borne such that, when the switch position of the switching device is changed, at least one of them can be pivoted through the drive axis area, in which the drive axis of the drive passes through the pivoting plane of the two coupling rods, or the drive axis crosses the pivoting plane of the two coupling rods. One advantage of this refinement of the high-voltage arrangement is that the internal design of the transmission allows energy-saving switching of the switching device. This is because the kinematics of the coupling rods have a positive influence on the movement of the contact elements. Since the coupling rods can pass the drive axis area of the drive this makes it possible, for example, to ensure that, when there is a change in the switch position of the switching device, the contact element which is being switched off is moved less than the contact element which is being switched on. By way of example, starting from the third switch position, in which both contact elements are switched off and there is thus an adequate isolating gap in each case from the counter contact element associated with them, this makes it possible to prevent the other contact element which remains switched off from also being moved synchronously when the one contact element is being switched on; this is because such a synchronous additional movement is not necessary at all from the electrical point of view, because the distance between the contact element and the counter contact element in the case of the switched-off contact element is already adequate, and need not be increased any more. The capability of the coupling rods to pivot through means that the deflection movement of the coupling rod which is being switched off can be considerably less than the deflection movement of the coupling rod which is being switched on, as a result of which the contact element which remains switched off is moved less than the contact element which is being switched on. Since every drive movement requires drive energy because of friction, the reduced movement travel of the contact element which remains switched off saves drive energy, in comparison to other switching devices in which the contact element which is being switched on and the contact elements which remain switched off are synchronously coupled and are each moved through deflection travels of the same magnitude. One advantage of this refinement of the high-voltage arrangement is that, because of the capability of the coupling rods to pivot or pass through the drive axis area, both the movement path of one of the electrical contact elements and the drive of the switching device can be arranged centrally in the housing of the high-voltage arrangement. By way of example, the movement path of one of the electrical contact elements can be arranged parallel to the center axis of the housing, and the drive axis can be arranged at right angles to the center axis, to be precise nevertheless in the housing center.

In order to allow a simple and low-cost transmission design, it is considered to be advantageous for the transmission to have a first and a second transmission plate, which are kept parallel and at a distance from one another by a first connecting rod and a second connecting rod, with the two connecting rods each being arranged at right angles to the transmission plates and parallel to the drive axis, and with the first connecting rod forming a first pivoting bearing for the first coupling rod, and the second connecting rod forming a second pivoting bearing for the second coupling rod.

The coupling rods can be made to pass through particularly easily if the drive is indirectly or directly connected to the first transmission plate, and the intermediate space between the two transmission plates remains free in the drive axis area for the coupling rods to pivot through.

The first and the second connecting rods are preferably at the same distance from the drive axis, in order to ensure that the movement characteristic of the contact elements from the third switch position to the second switch position is identical to the movement characteristic of the contact elements from the third switch position to the first switch position.

The drive is preferably connected to the first transmission plate in order that it can rotate the latter about the drive axis; in this case, the second transmission plate is also rotated by the two connecting rods with the first transmission plate.

The second transmission plate is preferably connected to a drive coupling element which is arranged coaxially with respect to the drive axis, such that said drive coupling element is also rotated during rotation of the first transmission plate and of the second transmission plate. By way of example, one end of the drive coupling element is connected to the second transmission plate, and its other end is connected to a first transmission plate of another or second switching device in the high-voltage arrangement. By way of example, the second switching device may be associated with a different electrical pole in the high-voltage arrangement. In an arrangement such as this, a single drive having a central drive axis can simultaneously switch a plurality of poles in the high-voltage arrangement.

The high-voltage arrangement preferably has two or more poles, and has a switching device for each electrical pole, with one of the switching devices being connected to the drive, and with the other switching devices each being connected indirectly to the drive via upstream switching devices and upstream drive coupling elements.

In order to achieve a compact transmission design, it is considered to be advantageous for the two coupling rods to be arranged on the same plane between the two transmission plates.

The invention will be explained in more detail in the following text with reference to exemplary embodiments; in this case, by way of example:

DESCRIPTION OF THE INVENTION

For the sake of clarity, the same reference symbols are always used for identical or comparable components in the figures.

Figure 1:
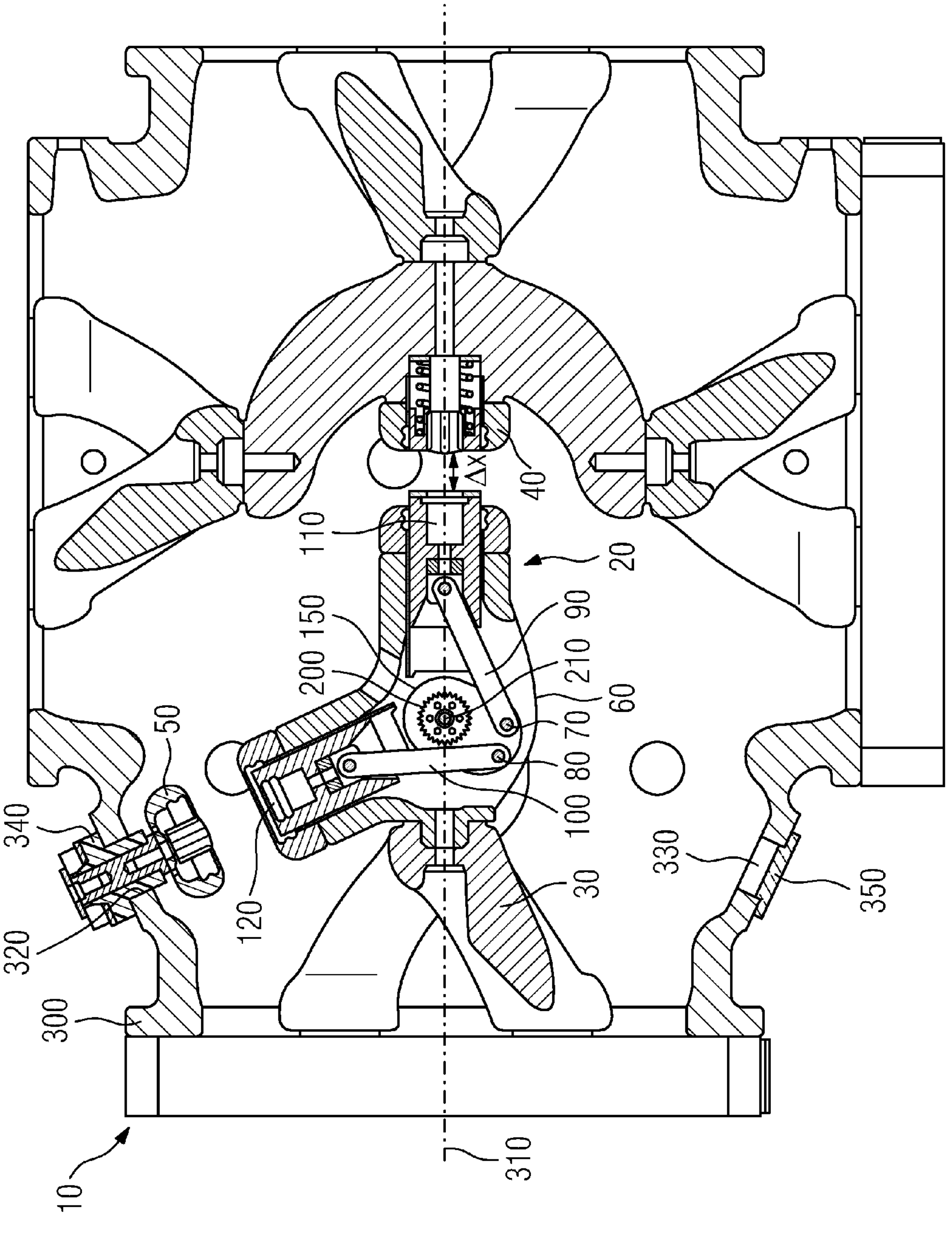
FIG. 1 shows a cross section through a first exemplary embodiment of a high-voltage arrangement according to the invention, with the high-voltage arrangement having two housing openings for fitting a ground contact connection and a viewing window.

FIG. 1 shows a high-voltage arrangement 10 in which a switching device 20 interacts with a first connection 30, a second connection 40 and a third connection 50.

The switching device 20 has a transmission 60 which is equipped with a first connecting rod 70 and a second connecting rod 80. The first connecting rod 70 forms a first pivoting bearing for a first coupling rod 90 of the transmission 60. The second connecting rod 80 forms a second pivoting bearing for a second coupling rod 100.

The pivotable bearing of the two coupling rods 90 and 100 allows them to be pivoted on a predetermined pivoting plane, which corresponds to the plane of the sheet in FIG. 1.

One contact element is associated with each of the two coupling rods 90 and 100, specifically with the first contact element 110 being associated with the first coupling rod 90, and the second contact element 120 being associated with the second coupling rod 100. The two contact elements 110 and 120 are borne such that they can move, and can be moved along their longitudinal direction during pivoting of the associated coupling rod. For example, the first contact element 110 can thus be moved in the direction of the second connection 40 by pivoting the first coupling rod 90, such that the first connection 30 is connected to the second connection 40. During such a pivoting movement of the coupling rod 90, the second coupling rod 100 is pivoted such that the second contact element 120 is pulled away from the third connection 50, and is pulled into the housing of the transmission 60.

The second contact element 120 can be connected in a corresponding manner to the third connection 50, by being moved in the direction of the third connection 50 by means of the second coupling rod 100. During a linear movement such as this, the first coupling rod 90 will pull the first coupling element 110 away from the second connection 40, and will pull it into the housing of the transmission 60.

The movement of the two contact elements 110 and 120, or the pivoting movement of the two coupling rods 90 and 100, is caused by two transmission plates 160 and 150, only the upper transmission plate 150 of which is shown in FIG. 1. In the illustration shown in FIG. 1, the lower transmission plate 160 is covered by the upper transmission plate 150.

Figure 3:
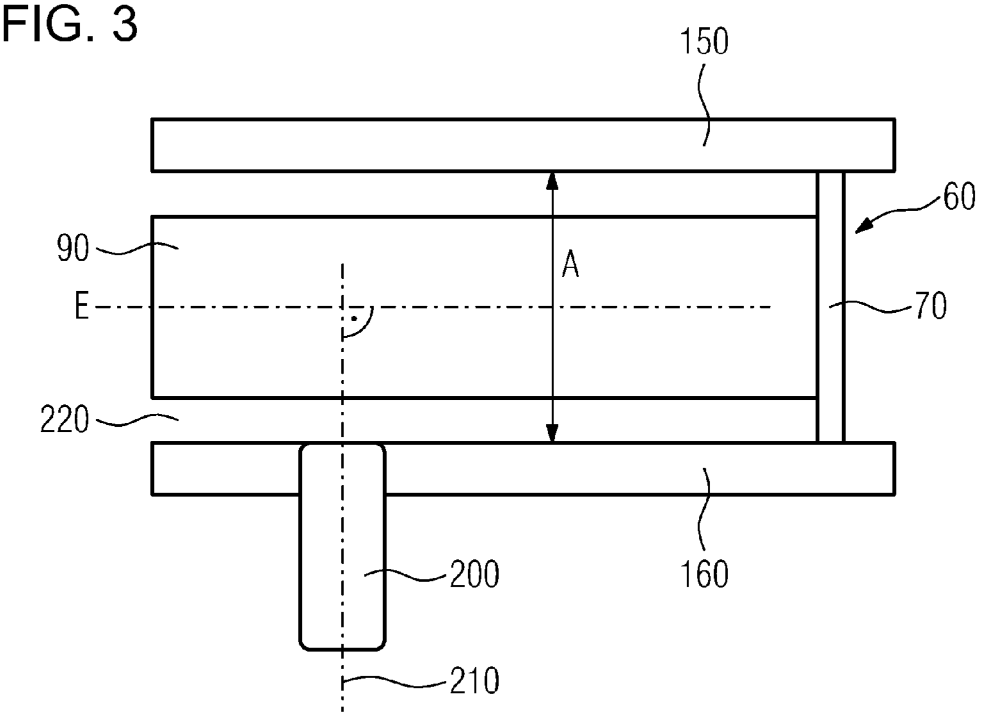
FIG. 3 shows a simplified illustration of the design of the transmission of the high-voltage arrangement as shown in FIG. 1, with FIG. 3 showing a view from the side.
Figure 4:
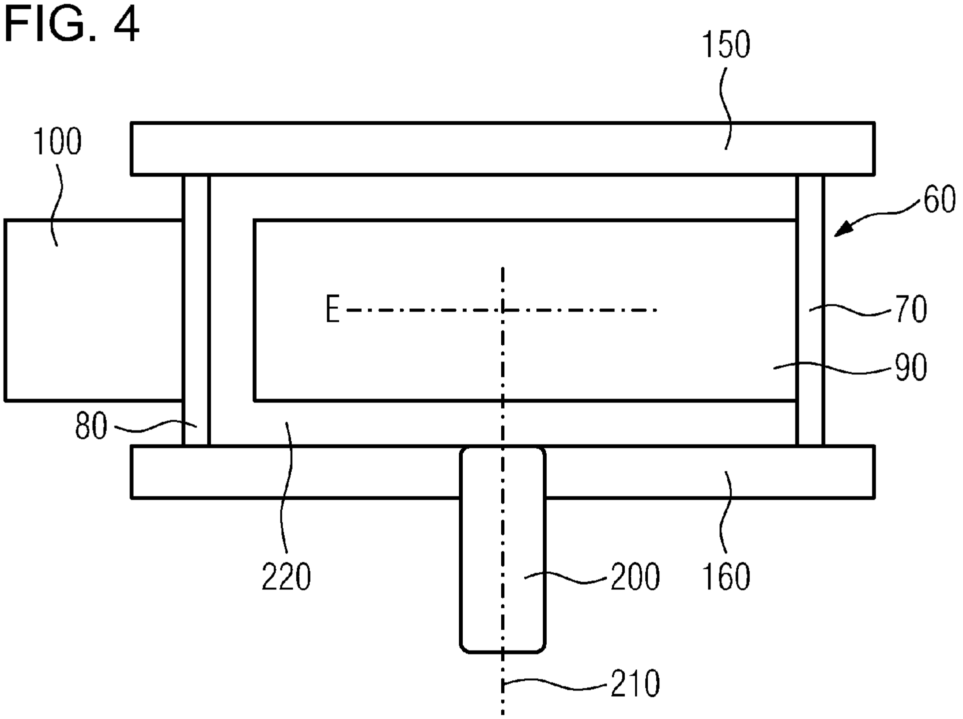
FIG. 4 shows a different view of the transmission of the high-voltage arrangement as shown in FIG. 3, likewise in a simplified schematic illustration.

FIGS. 3 and 4 show the arrangement of the two transmission plates 150 and 160 relative to one another in detail. The two transmission plates 150 and 160 are arranged parallel to one another, and are at a distance from one another. They are connected to one another by the two connecting rods 70 and 80, and are held at a distance apart by them.

In order to pivot the two coupling rods 90 and 100, the lower transmission plate 160 is indirectly or directly connected to a drive 200, whose drive axis 210 is arranged at right angles to the plane of the drawing in FIG. 1. When the drive 200 is switched on, then the lower transmission plate 160 is rotated about the drive axis 210, as a result of which the upper transmission plate 150, which is illustrated in FIG. 1, is also rotated, since the two transmission plates 150 and 160 are connected to one another via the two connecting rods 70 and 80, and the pivoting bearings formed thereby. Rotation of the transmission plates 150 and 160 about the drive axis 210 allows the coupling rods 90 and 100, which are borne such that they can pivot, to pivot, thus moving the contact elements 110 and 120—as already explained.

The design of the transmission 60 will now be explained in more detail with reference to the illustrations in FIGS. 3 and 4. Both FIGS. 3 and 4 show schematic illustrations of a side view of the transmission 60. In this case, FIG. 3 shows the upper transmission plate 150, which is also illustrated in FIG. 1, and the lower transmission plate 160 as well. Furthermore, the figure shows the connecting rod 70 which connects the transmission plate 150 to the transmission plate 160. The connecting rod 70 forms the pivoting bearing for the first coupling rod 90, which can be pivoted in the space between the two transmission plates 150 and 160.

In order to allow the first coupling rod 90 and, analogously to this as well, the second coupling rod 100 to pivot through the drive axis area 220 in which the drive axis 210 of the drive 200 passes through the pivoting plane E of the two coupling rods, the drive 200 is arranged such that it is indirectly or directly connected exclusively to the lower transmission plate 160 in FIG. 3. In other words, the drive 200 therefore does not extend into the drive axis area 220, nor into the space area between the two transmission plates 150 and 160. The space area between the two transmission plates 150 and 160 is therefore free of any drive.

The mechanical coupling between the two transmission plates 150 and 160 is provided by the two connecting rods 70 and 80 such that the upper transmission plate 150 is also correspondingly rotated when the lower transmission plate 160 is rotated about the drive axis 210. Such rotation results in the two connecting rods 70 and 80 being pivoted about the drive axis 210, thus resulting in a pivoting movement of the associated coupling rods 90 and 100, as well.

FIG. 4 shows another view of the transmission 60. In this illustration, both the first connecting rod 70 and the second connecting rod 80 as well as the coupling rods 90 and 100 which are connected to them are shown. As can be seen, in the illustration in FIG. 4, the first coupling rod 90 is pivoted into the drive axis area 220, and therefore crosses the drive axis 210. The second coupling rod 100 is pivoted out of the drive axis area 220.

The distance between the two transmission plates 150 and 160, which are arranged parallel, at least approximately parallel, is annotated with the reference symbol A in FIG. 3.

FIG. 1 furthermore shows that the high-voltage arrangement 100 has a housing 300 with a center axis 310. The center axis 310 runs through the housing center and preferably forms an axis of symmetry of the housing 300. In other words, the housing 300 is therefore preferably axially symmetrical about the axis of symmetry 310.

The housing 300 is equipped with two housing openings 320 and 330, which are preferably identical. The third connection 50 of the high-voltage arrangement 10 is mounted on the housing opening 320 by means of an attachment element 340. A viewing window 350 is fitted to the housing opening 330, through which viewing window 350 it is possible to look into the housing 300 in order to check the switching state of the switching device 20.

Since the two housing openings 320 and 330 are identical, it is possible to interchange the fitting of the third connection 50 and the fitting of the viewing window 350; contrary to the illustration shown in FIG. 1, the attachment element 340 and the third connection 50 can therefore also be fitted to the housing opening 330, and the viewing window 350 can be fitted to the housing opening 320.

Figure 2:
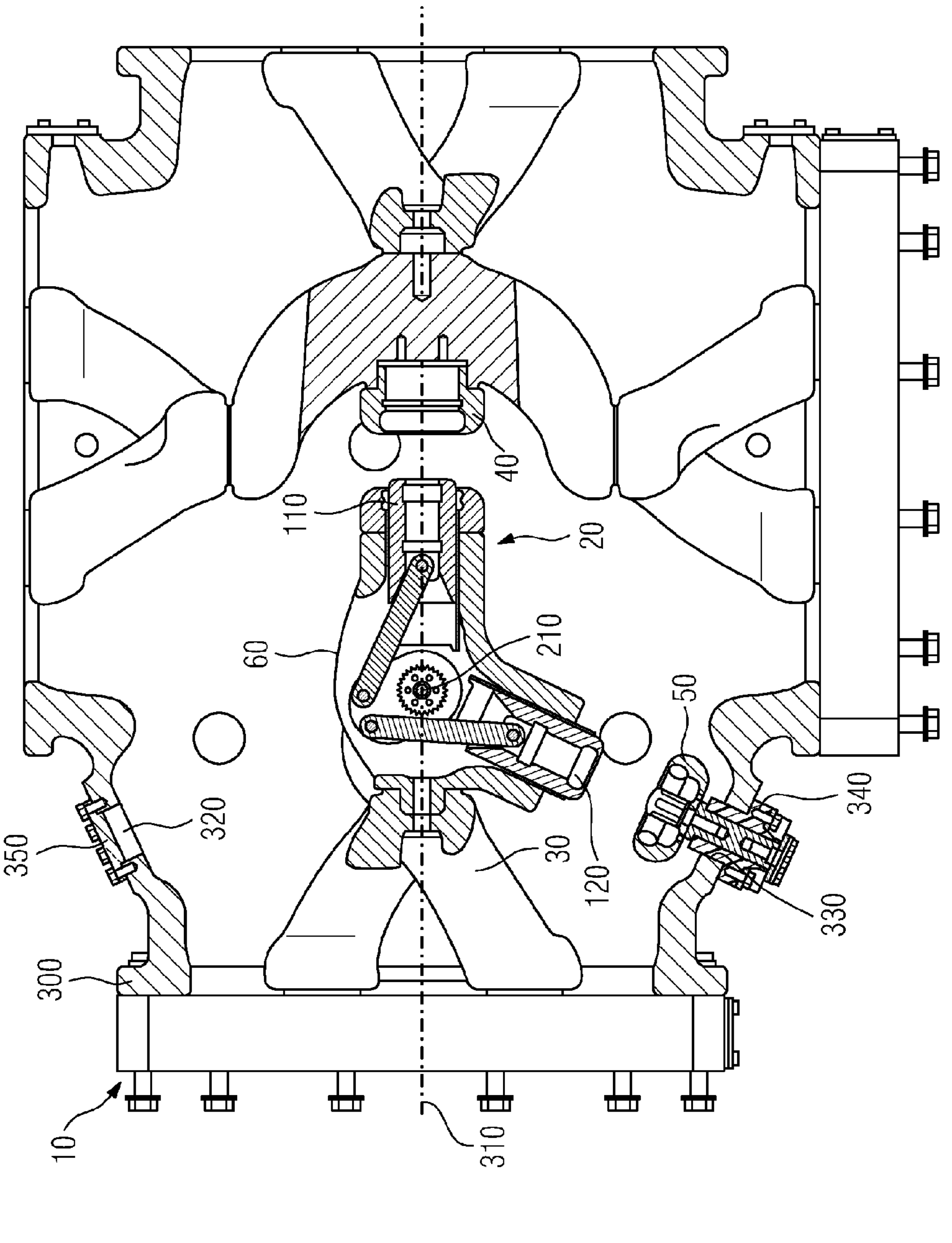
FIG. 2 shows the high-voltage arrangement as shown in FIG. 1, with the point where the viewing window is fitted and that where the ground contact connection is fitted in the two housing openings in the housing being interchanged.

Such fitting of the attachment element 340 and of the viewing window 350 is illustrated in FIG. 2. FIG. 2 shows that the third connection 50 is now fitted to the housing opening 330 by means of the attachment element 340. The viewing window 350 is located in the housing opening 320.

In order to ensure the interaction of the third connection 50 with the switching device 20, said switching device 20 is fitted pivoted through 180° by fitting the housing 60 to the drive 200 pivoted through 180°. Such pivoting of the transmission 60 and of the switching device 20 through 180° is possible specifically because the drive 200 and the drive axis 210 are arranged in the housing center, that is to say on the center axis 310. If the drive axis 210 were to be arranged off-center, then the transmission 60 could not be pivoted in the described manner.

Furthermore, as can be seen, the arrangement of the contact element 110 in the transmission 60 is chosen such that the first contact element 110 is moved along the center axis 310. The movement path $\Delta x$ therefore in other words lies on the center axis 310. The corresponding arrangement of the movement path $\Delta x$ and the corresponding arrangement of the first contact element 110 likewise ensure the already explained pivoting capability of the transmission 60 and the pivoting capability of the switching device 20 overall about the center axis 310.

Furthermore, as can be seen from FIG. 1, the movement path $\Delta x$ of the first contact element 110 runs at right angles to the drive axis 210; a corresponding situation applies to the movement path of the second contact element 120, which is likewise aligned at right angles to the drive axis 210.

The size of the two housing openings 320 and 330 is preferably chosen such that both the position of the first contact element 110 and the position of the second contact element 120 can be seen through the viewing window 350, in order to allow the switch position of the switching device 20 to be checked visually from the outside. One preferred refinement and arrangement of the two housing openings 320 and 330 will be explained in more detail in the following text in conjunction with FIGS. 5 to 7.

Figure 5:
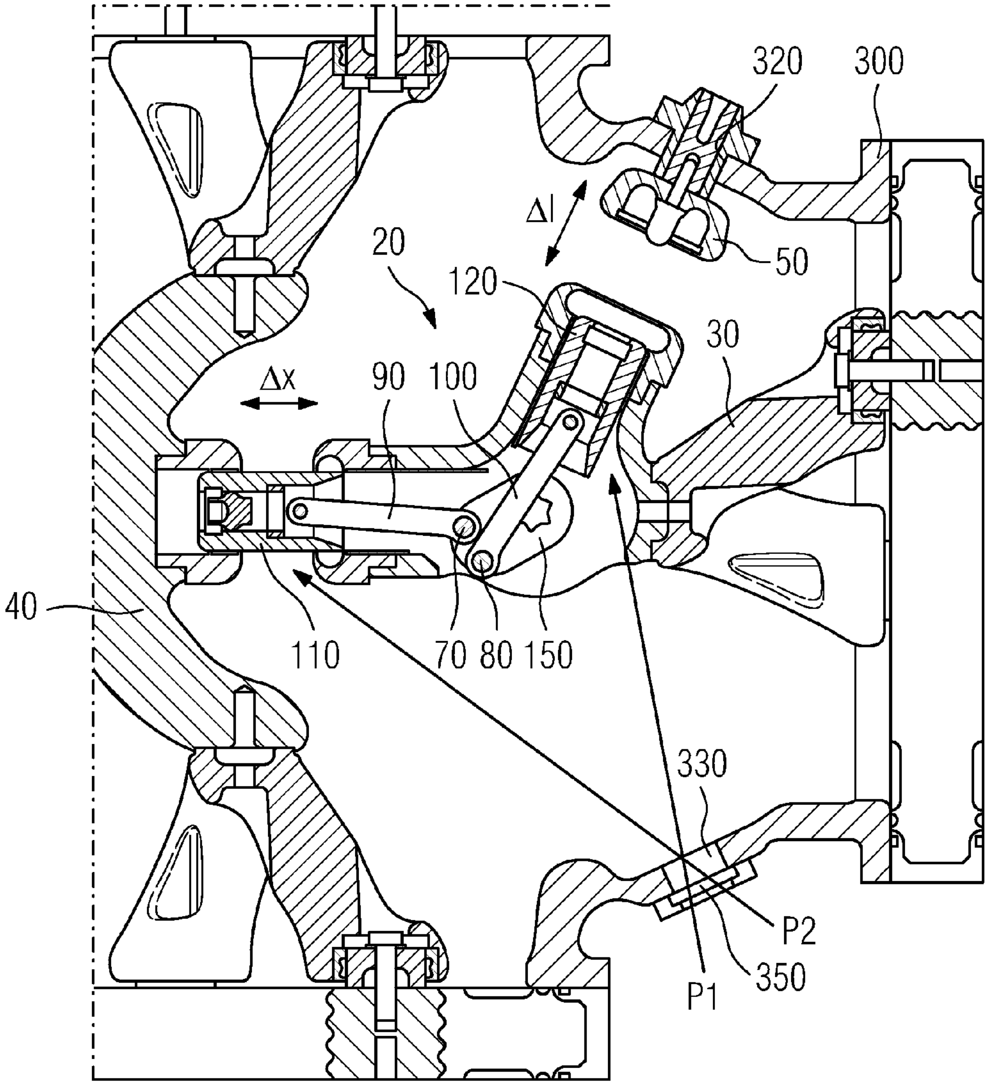
FIG. 5 shows a second exemplary embodiment of a high-voltage arrangement according to the invention, with the arrangement of the viewing window relative to the transmission being explained in more detail, and with the first switch position of the switching device being shown.

FIG. 5 shows a second exemplary embodiment of a high-voltage arrangement. As can be seen, in this exemplary embodiment as well, the housing 300 has a center axis and is preferably axially symmetrical, at least essentially axially symmetrical, thus allowing fitting of the viewing window 350 both to the housing opening 330 and to the housing opening 320. In the exemplary embodiment shown in FIG. 5, the viewing window 350 is fitted to the housing opening 330, and the third connection 50 is fitted to the housing opening 320.

FIG. 5 shows a first switch position of the switching device 20 of the high-voltage arrangement 10. In this first switch position, the switching device 20 connects the first connection 30 to the second connection 40, the switching device 20 moving the contact element 110 in the direction of the second connection 40. The corresponding movement is caused by the first coupling rod 90, which is pushed in the direction of the second connection 40 by the connecting rod 70.

The corresponding rotary movement of the two transmission plates 150 and 160 also pivots the connecting rod 80, thus resulting in a pivoting movement of the second coupling rod 100. As can be seen from FIG. 5, the second coupling rod 100 is pivoted into the drive axis pivoting area 220 of the transmission 60 and in the process crosses the drive axis 210 of the drive 200. Such pivoting of the second coupling rod 100 is possible because the space between the two transmission plates 150 and 160 is free, and the drive 200 does not extend into this area.

The pivoting movement of the second coupling rod 100, as illustrated in FIG. 5, pulls the second contact element 120 away from the third connection 50, and pulls it into the housing of the transmission 60. The second contact element 120 therefore makes no electrical contact with the third connection 50. The described kinematics, which are caused by the arrangement of the two connecting rods 70 and 80 on the transmission plates 150 and 160, result in the linear movement and the movement path of the two contact elements 110 and 120 not being the same. In other words—starting from the third (neutral) switch position, as is shown in FIGS. 1 and 2—the movement path Δx of the first contact element 110 will be considerably greater than the movement path Δ1 of the second contact element 120, which is pulled into the housing of the transmission 60 when the first switch position is selected, as is shown in FIG. 5.

The shortened movement path of the second contact element 120 reduces the force applied and therefore the movement energy which is required for switching the switching device 20. In other words, the kinematics of the transmission 60 ensure that—starting from the third switch position—the contact element to be moved away or to be disconnected need be moved only as far as is necessary for disconnection of the electrical connection. The contact element which is intended to make an electrical connection is, in contrast to this, deflected completely, or moved more, however.

Figure 6:
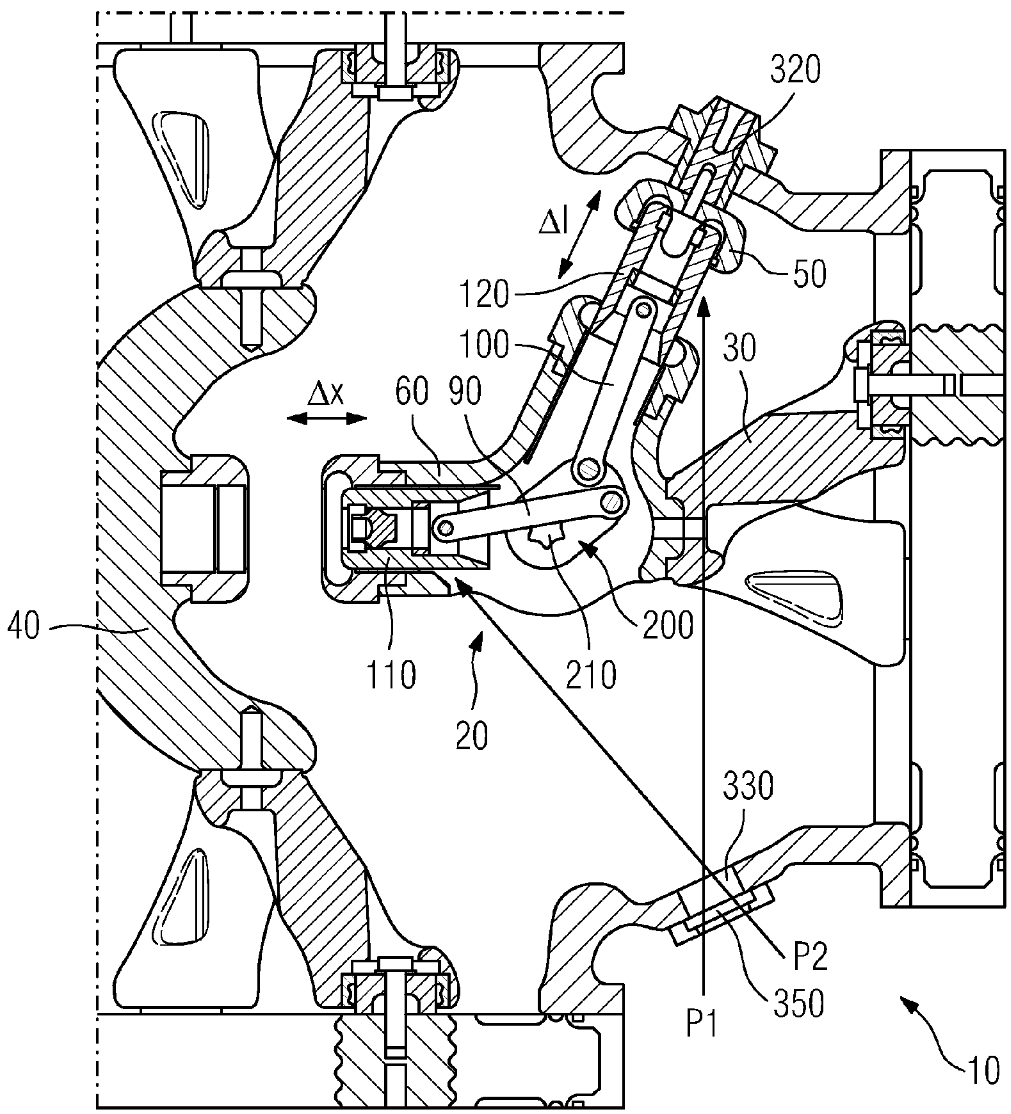
FIG. 6 shows the high-voltage arrangement as shown in FIG. 5, with the switching device in the second switch position.

FIG. 6 shows the second switch position of the switching device 20 as shown in FIG. 5. As can be seen, in this second switch position, the first connection 30 is connected to the third connection 50. Because the third connection 50 is electrically connected to the housing 300 of the high-voltage arrangement 10, the third connection 50 forms a ground connection, thus grounding the first connection 30 in the second switch position, as shown in FIG. 6. The second connection 40 remains unconnected in the second switch position, and, for example, is floating.

FIG. 6 likewise provides a clear illustration of the method of operation of the transmission 60 and the pivoting movement of the two coupling rods 90 and 100. As can be seen, in the second switch position, the first coupling rod 90 pivots through the drive axis area, or passes through it, and thus crosses the drive axis 210 of the drive 200.

The kinematics provided by the transmission 60 also ensure that the movement path of the contact element to be switched on, in this case the second contact element 120, is greater than the movement path of the contact element to be disconnected, in this case the first contact element 110. The movement process within the transmission 60 therefore reduces the movement path of the contact to be disconnected, as soon as it enters the area of the housing of the transmission 60.

As can also be seen well from FIG. 6—indicated by arrows P1 and P2—the size of the two housing openings 320 and 330 and their arrangement are also chosen such that both the position of the first contact element 110 and the position of the second contact element 120 can be seen through the viewing window 350.

Figure 7:
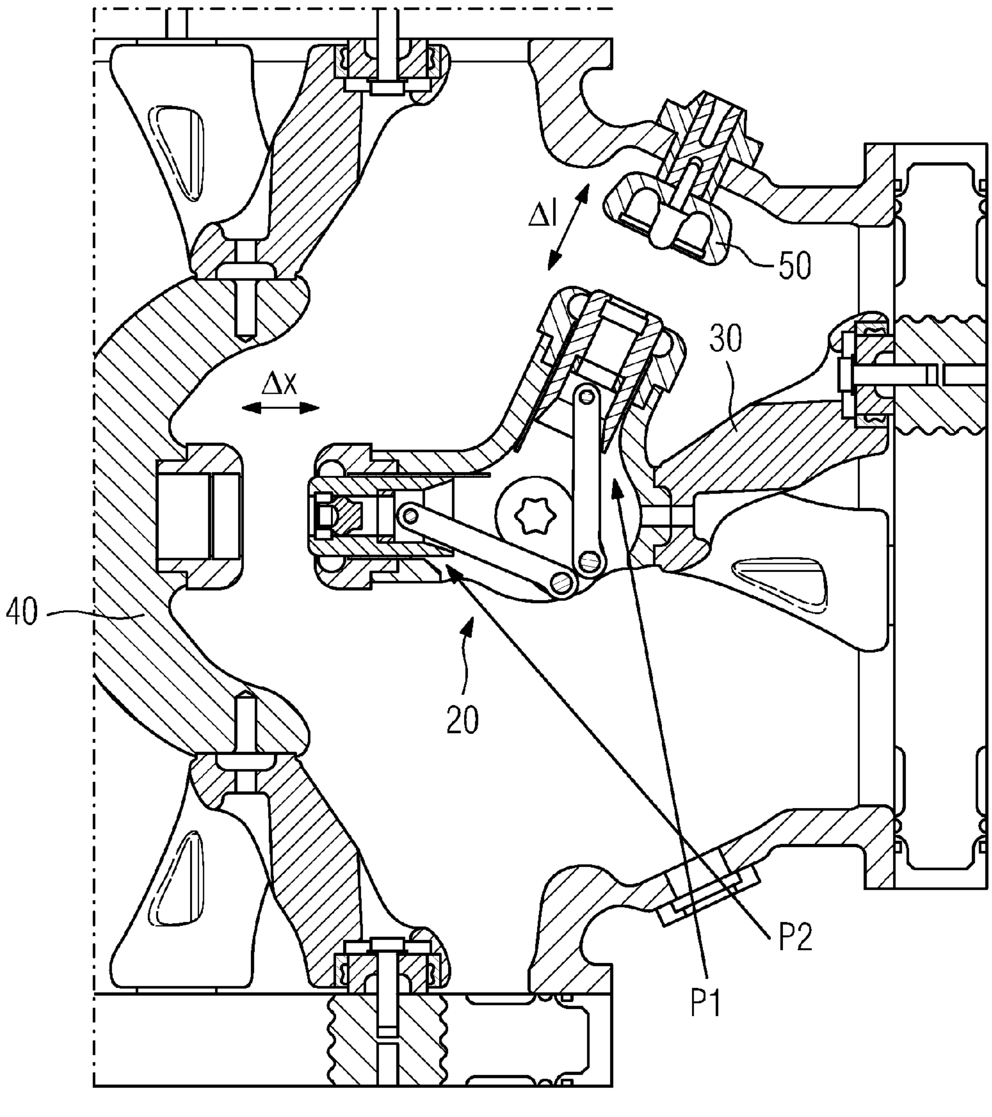
FIG. 7 shows the third switch position of the switching device in the high-voltage arrangement as shown in FIG. 5.
Figure 8:
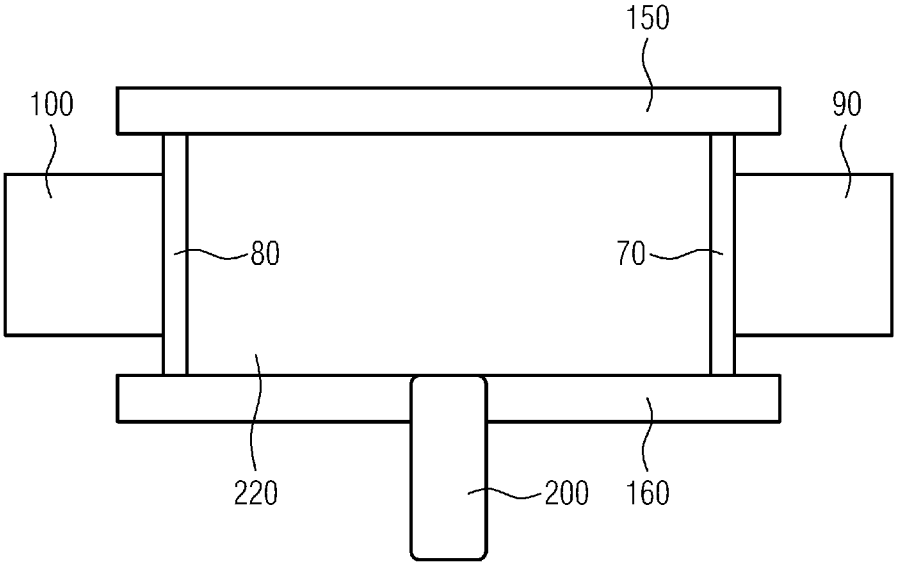
FIG. 8 shows a simplified illustration of the design of the transmission of the high-voltage arrangement as shown in FIG. 5, with the third switch position of the switching device being shown.

FIG. 7 shows the third switch position of the switching device 20 of the high-voltage arrangement 10 as shown in FIG. 5. In this third switch position, the three connections 30, 40 and 50 are unconnected. The resultant position or deflection of the two coupling rods 90 and 100 in a switch position such as this is illustrated once again schematically, in the form of a side view, in FIG. 8.

In order to simplify identification of the switch position of the switching device 20, it is also possible to provide for the housing of the transmission 60 to have openings through which it is possible to look into the transmission, in order to determine the position of the contact elements. The arrows P1 and P2 in FIGS. 5-7 indicate this possibility.

The method of operation of the high-voltage arrangement 10 has been explained for a single electrical pole with reference to FIGS. 1 to 8. By way of example, the following text will now also explain that a multi-pole high-voltage arrangement is also possible, for example by cascading the drive devices.

Figure 9:
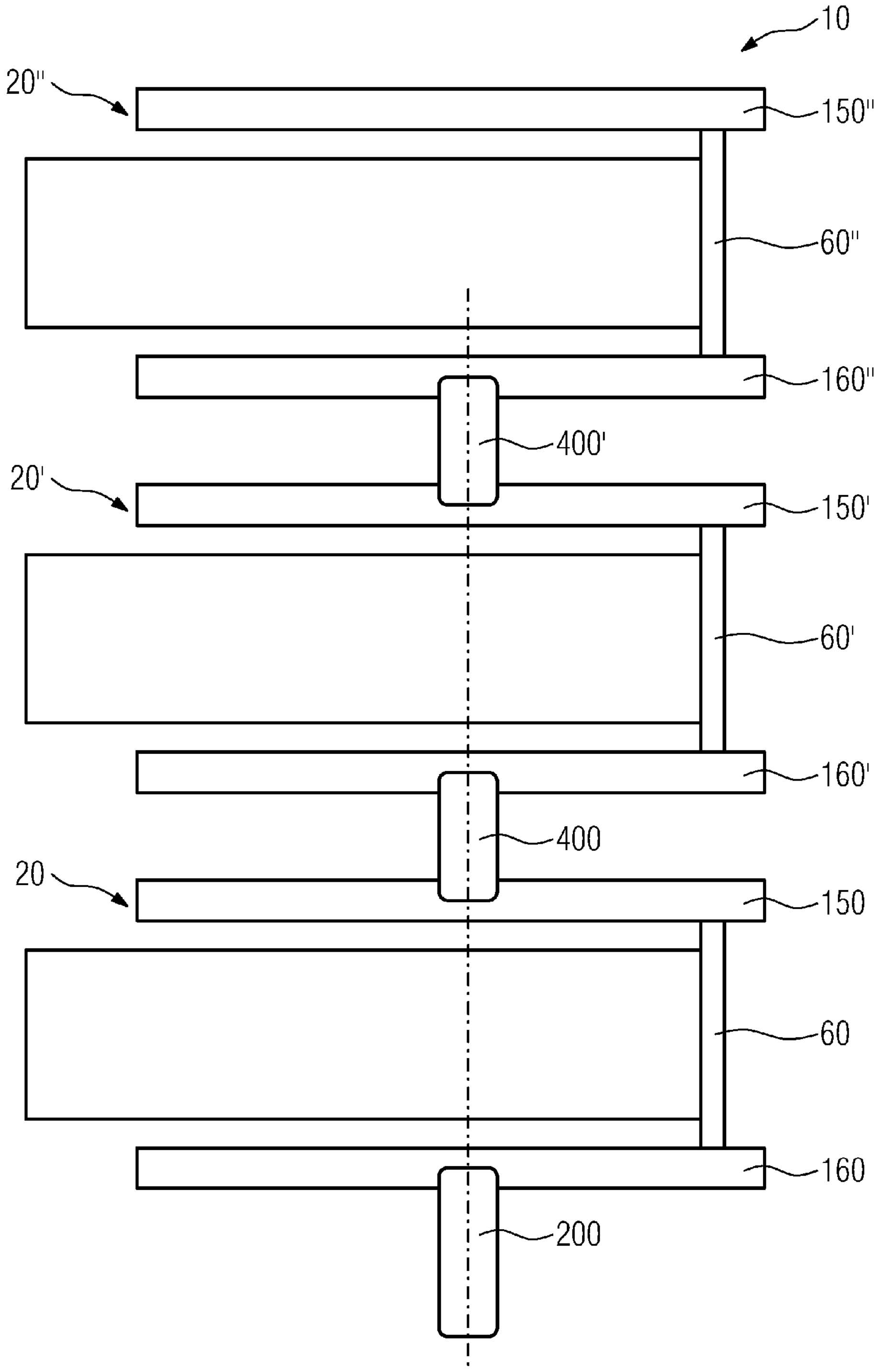
FIG. 9 shows a cascaded arrangement of switching devices, in which one of the switching devices is connected directly to a drive and the other switching devices are connected indirectly to the drive via drive coupling elements.

FIG. 9 shows one exemplary embodiment of a high-voltage arrangement in which three switching devices 20, 20' and 20" are provided for the three poles of a three-pole power transmission device. Each of the switching devices 20, 20' and 20" has a respective transmission 60, 60' and 60", with each transmission in each being equipped with two transmission plates 150, 160, 150', 160', 150" and 160". As can be seen in FIG. 9, only the lower switching device 20 in FIG. 9 is connected directly to the drive 200 of the high-voltage arrangement 10. The other switching devices 20' and 20" are connected to the drive 200 only indirectly, specifically via drive coupling elements 400 and 400', which connect the transmissions 60, 60' and 60" to one another.

The method of operation of the high-voltage arrangement as shown in FIG. 9 may now appear, for example, as follows: when the drive 200 is operated, then this results in the transmission plate 160 of the lower transmission 60 being rotated, which necessarily also results in rotation of the upper transmission plate 150 of the transmission 60. Since the upper transmission plate 150 of the transmission 60 is connected to the lower transmission plate 160' of the transmission 60', this lower transmission plate 160' will also rotate as soon as the drive 200 is active. Once again, this leads to the upper transmission plate 150' of the transmission 60' also pivoting and, via the second drive coupling element 400', to the two transmission plates 150" and 160" of the second transmission 60" also pivoting.

In summary, it can be stated that the cascading arrangement of the switching devices 20, 20' and 20" makes it possible to provide a three-pole high-voltage arrangement in which the drive 200 and the drive axis 210 can be arranged in the area of the center axis 310, or of the axis of symmetry of the housing 300. An arrangement of the drive axis 210 in the area of the center axis 310 makes it possible—assuming an appropriate configuration of the transmission 60—for the transmission 60 to be fitted aligned in different ways within the housing 300 of the high-voltage arrangement.

LIST OF REFERENCE SYMBOLS

10 High-voltage arrangement
20 Switching device

20' Switching device
20" Switching device
30 Connection
40 Connection
50 Connection
60 Transmission
60' Transmission
60" Transmission
70 Connecting rod
80 Connecting rod
90 Coupling rod
100 Coupling rod
110 Contact element
120 Contact element
150 Transmission plate
150' Transmission plate
150" Transmission plate
160 Transmission plate
160' Transmission plate
160" Transmission plate
200 Drive
210 Drive axis
220 Drive axis area
300 Housing
310 Center axis/axis of symmetry
320 Housing opening
330 Housing opening
340 Attachment element
350 Viewing window
400 Drive coupling element
400' Drive coupling element
E Pivoting plane
A Distance
Δx Movement path
Δ1 Movement path
P1 Arrow
P2 Arrow

The invention claimed is:

1. A high-voltage arrangement, comprising:

at least one switching device;

a drive for driving said at least one switching device; and a housing having a first housing opening and a second housing opening formed therein, said first housing opening and said second housing opening each being configured for selectively fitting a viewing window or a ground contact connection thereto; and wherein said first and second housing openings and a viewing window inserted into one of said first and second housing openings are of such a size and are aligned such that:

a position of a first electrical contact element of said at least one switching device disposed to connect a first connection and a second connection to one another; and a position of a second electrical contact element of said at least one switching device disposed to connect the first connection and a third connection to one another;

are visible from outside and viewable through said viewing window.

2. The high-voltage arrangement according to claim 1, wherein:

said housing is an axially symmetrical housing having an axis of symmetry; and said first housing opening and said second housing opening are symmetrically opposite one another with respect to the axis of symmetry.

3. The high-voltage arrangement according to claim 1, wherein said ground contact connection forms a third connection of the high-voltage arrangement, and said ground contact connection is connectable by said switching device to a first contact thereof.

4. A high-voltage arrangement, comprising:

a housing having a first opening and a second opening formed therein, each of said first opening and said second opening being configured for selectively fitting a viewing window or a ground contact connection and to be closed off either by the viewing window or the ground contact connection;

at least one switching device disposed in said housing, said switching device being mountable in two mutually different orientations and being mounted with an orientation that depends on whether the ground contact connection is disposed in said first opening or said second opening;

a drive for driving said at least one switching device.

* * * * *